United States Patent
Berdichevsky et al.

(10) Patent No.: US 8,044,786 B2
(45) Date of Patent: Oct. 25, 2011

(54) SYSTEMS AND METHODS FOR DIAGNOSING BATTERY VOLTAGE MIS-REPORTING

(75) Inventors: Eugene Michael Berdichevsky, San Francisco, CA (US); Philip David Cole, Redwood City, CA (US); James Jay Dunlay, Los Gatos, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 772 days.

(21) Appl. No.: 12/142,514

(22) Filed: Jun. 19, 2008

(65) Prior Publication Data
US 2009/0315698 A1 Dec. 24, 2009

(51) Int. Cl.
*B60Q 1/00* (2006.01)

(52) U.S. Cl. ..... 340/455; 340/456; 340/569; 340/686.6; 340/636.1; 340/514; 320/116; 320/118; 320/119; 320/120; 320/126; 320/149; 320/162

(58) Field of Classification Search ............. 340/455, 340/456, 569, 686.6, 636.1, 636.6, 514; 320/116, 320/118, 119, 120, 126, 149, 162
See application file for complete search history.

(56) References Cited

U.S. PATENT DOCUMENTS

| | | | | |
|---|---|---|---|---|
| 4,388,582 A * | 6/1983 | Saar et al. | | 320/156 |
| 4,746,852 A * | 5/1988 | Martin | | 320/106 |
| 6,472,879 B2 * | 10/2002 | Park | | 324/426 |
| 6,841,972 B2 | 1/2005 | Koo | | |
| 7,439,710 B2 * | 10/2008 | Ishishita | | 320/132 |
| 2004/0257049 A1 * | 12/2004 | Trinh et al. | | 320/145 |

* cited by examiner

*Primary Examiner* — Tai T Nguyen
(74) *Attorney, Agent, or Firm* — Patent Law Office of David G. Beck (57) ABSTRACT

Systems and methods for diagnosing battery voltage misreporting is described. According to various embodiments, battery voltage may be monitored with respect to a state of charge and/or time. Based on this monitored information, battery charge state data may be generated by computing time derivatives of the monitored battery voltage across a voltage range. This battery charge state data may be compared with an expected set of charge state data if substantial differences exist, an error may be generated. Other embodiments are described and claimed.

23 Claims, 5 Drawing Sheets

SYSTEMS AND METHODS FOR DIAGNOSING BATTERY VOLTAGE MIS-REPORTING

BACKGROUND

An extremely large percentage of the world's vehicles run on gasoline using an internal combustion engine. The use of such vehicles, more specifically the use of vehicles which rely on fossil fuels (i.e., gasoline) creates two problems. First, due to the finite size and limited regional availability of such fuels, major price fluctuations and a generally upward pricing trend in the cost of gasoline are common, both of which can have a dramatic impact at the consumer level. Second, fossil fuel combustion is one of the primary sources of carbon dioxide, a greenhouse gas, and thus considered one of the leading contributors to global warming. Accordingly, considerable effort has been spent on finding alternative drive systems for use in both personal and commercial vehicles. Electric vehicles offer one of the most promising alternatives to vehicles that use internal combustion drive trains.

One of the main components relating to electric drive and energy storage is the battery. It is important to have accurate reporting of battery voltages and charge states. Misreporting can cause a loss in efficiency and overcharging. In some cases overcharging can even cause fire or explosion. Some systems may use redundant battery monitoring circuits to combat misreporting issues. If one circuit fails, there is a backup.

BRIEF DESCRIPTION OF THE DRAWINGS

Embodiments of inventive subject matter may be best understood by referring to the following description and accompanying drawings, which illustrate such embodiments. In the drawings.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1:
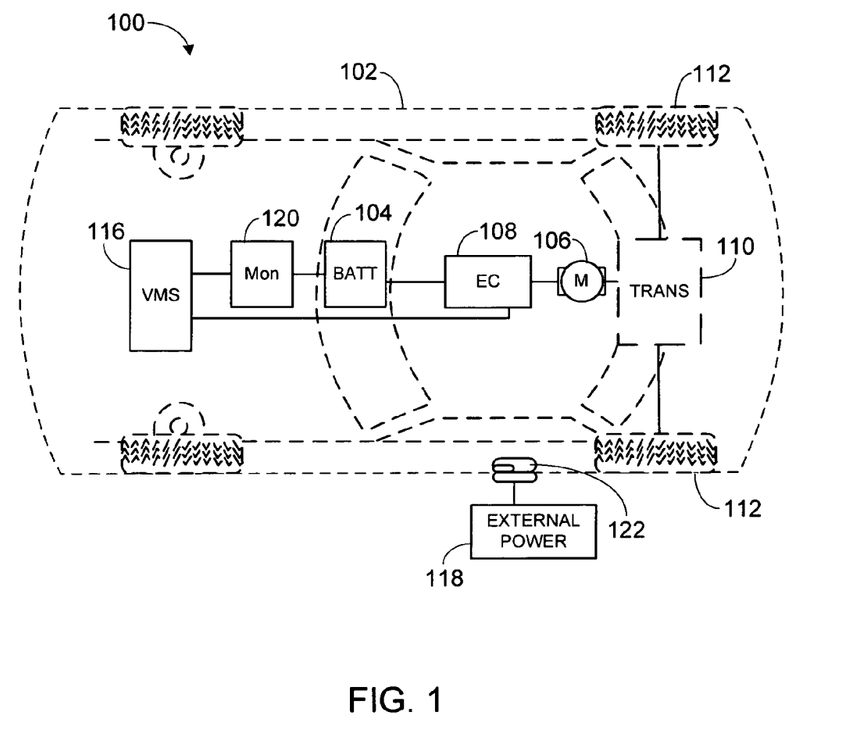
FIG. 1 shows a vehicle system according to one embodiment of the present subject matter.

FIG. 1 shows an electric vehicle system 100 according to one embodiment of the present subject matter. In various embodiments, the vehicle 102 is an electric vehicle and includes a vehicle propulsion battery 104, one or more battery monitoring circuits 120 and at least one propulsion motor 106 for converting battery energy into mechanical motion, such as rotary motion. According to some embodiments, the monitoring circuits 120 may be built into the battery 104.

The vehicle propulsion battery 104 includes a lithium ion battery in various examples. In some examples, the vehicle propulsion battery 104 includes a plurality of lithium ion batteries coupled in parallel and/or series. Some examples include cylindrical lithium ion batteries. In some examples, the battery includes one or more batteries compatible with the 18650 battery standard, but the present subject matter is not so limited. Some examples include a number batteries which are interconnected in parallel and in series. The vehicle propulsion battery 104, in some examples, provides approximately 390 volts. The term "battery" used herein may describe a single battery cell, or a group or pack of battery cells. Although Li-ion batteries are used as examples, the inventive subject matter is not limited in any way to just Li-ion battery chemistry. Other types and configurations of batteries are contemplated, including but not limited to NiCD, NiMH, Li-Polymer, Lead Acid and others.

Additionally illustrated is an energy converter 108. The energy converter 108 is part of a system which converts energy from the vehicle propulsion battery 104 into energy useable by the at least one propulsion motor 106. In some instances, the energy flow is from at least one propulsion motor 106 to the vehicle propulsion battery 104. As such, in some examples, the vehicle propulsion battery 104 transmits energy to the energy converter 108, which converts the energy into energy usable by the at least one propulsion motor 106 to propel the electric vehicle. In additional examples, at least one propulsion motor 106 generates energy that is transmitted to the energy converter 108. In these examples, the energy converter 108 converts the energy into energy which can be stored in the vehicle propulsion battery 104. In some examples, the energy converter 108 includes transistors. Some examples include one or more field effect transistors. Some examples include metal oxide semiconductor field effect transistors. Some examples include one or more insulated gate bipolar transistors. As such, in various examples, the energy converter 108 includes a switch bank which is configured to receive a direct current ("DC") power signal from the vehicle propulsion battery 104 and to output a three-phase alternating current ("AC") signal to power the vehicle propulsion motor 106. In some examples, the energy converter 108 is configured to convert a three phase signal from the vehicle propulsion motor 106 to DC power to be stored in the vehicle propulsion battery 104. Some examples of the energy converter 108 convert energy from the vehicle propulsion battery 104 into energy usable by electrical loads other than the vehicle propulsion motor 106. Some of these examples switch energy from approximately 390 Volts to approximately 14 Volts.

The propulsion motor 106 may be a three phase AC propulsion motor, in various examples. Some examples include a plurality of such motors. The present subject matter can optionally include a transmission 110 in some examples. While some examples include a 2-speed transmission, other examples are contemplated. Manually clutched transmissions are contemplated, as are those with hydraulic, electric, or electrohydraulic clutch actuation. Some examples employ a dual-clutch system that, during shifting, phases from one clutch coupled to a first gear to another clutch coupled to a second gear. Rotary motion is transmitted from the transmission 110 to wheels 112 via one or more axles 114, in various examples.

A vehicle management system 116 is optionally included which provides control for one or more of the vehicle propulsion battery 104 and the energy converter 108. In some examples, the vehicle management system 116 may be coupled to vehicle systems which monitor battery characteristics (i.e. battery monitoring circuit 120) or safety (such as a crash sensor). In some examples the vehicle management system 116 is coupled to one or more driver inputs (such as a speed adjuster or accelerator, colloquially termed a throttle, although the present subject matter is not limited to examples having an actual throttle). The vehicle management system 116 may be configured to control power to one or more of the vehicle propulsion battery 104 and the energy converter 108, in various embodiments.

A charging station 118 may be provided to transmit energy with the vehicle propulsion battery 104, in various examples. In some examples, the charging station converts power from a 110V AC power source into power storable by the vehicle propulsion battery 104. In additional examples, the charging station converts power from a 220V AC power source into power storable by the vehicle propulsion battery 104. The present subject matter is not limited to examples in which a converter for converting energy from an external source to energy usable by the vehicle 102 is located outside the vehicle 102, and other examples are contemplated.

Figure 2:
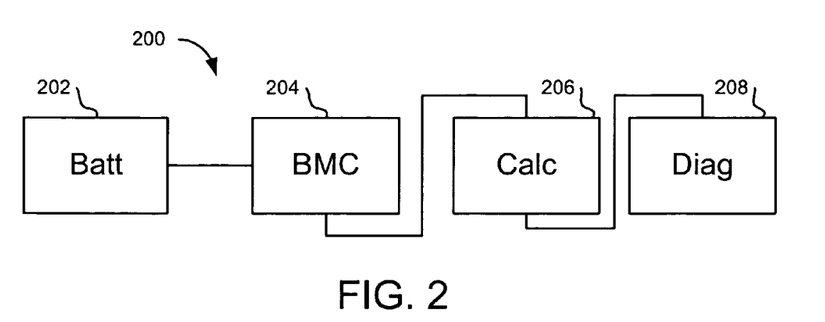
FIG. 2 is a block diagram of a system for diagnosing battery voltage misreporting according to various embodiments.

FIG. 2 is a block diagram of a system 200 for diagnosing battery voltage misreporting according to various embodiments. The system 200 includes a battery monitoring circuit (BMC) 204 monitoring a battery 202, a calculation module 206 and a diagnostic module 208.

The BMC 204 may monitor the voltage in the battery 202 with respect to time and/or with respect to charge state (percentage charge of the battery 202). The BMC 204 may monitor and record this information during charging or during discharge. The monitored battery information may be stored at the BMC 204 for transfer to the calculation module 206 or may be transmitted directly without storage. The calculation module 206 may use the monitored battery information to calculate battery charge state data including time derivative calculations of the monitored battery voltage within a range of voltages for the battery. The time derivative calculations may include data regarding the change in voltage over a change in time at various voltages. Other calculations may be performed as well by the calculation module 206, including generating a curve on an x-y axis (see FIG. 5B, which will be discussed in more detail below) representing the time derivative of the voltage versus voltage. The curve may also be integrated to determine that area beneath the curve, and a centroid of that area may be calculated. Any or all of the calculations of the battery charge state data, the corresponding curve, area or centroid may be then sent to the diagnostic module 208.

The diagnostic module 208 may receive the calculated data from the calculations module 206. This data may at least include the battery charge state data. The diagnostic module 208 may take the calculated data received from the calculations module 206 and compare it with an expected set of data. The expected set of data may be based on charge state data of another battery or a reference or idealized battery. As an example, the diagnostic module may compare the battery charge state data with a reference set of charge state data. The reference set of charge data may be based on data expected of an idealized battery—a battery acting as expected under certain temperature, driving, age, and other characteristics. The other battery charge state data may also be based on an average or mean or other statistical analysis of multiple batteries. According to another embodiment, the diagnostic module 208 may compare the battery charge state data with charge state data calculated from other battery monitoring circuits monitoring other similar batteries. If there is a difference between the battery charge state data and the expected set of data which exceeds a predetermined amount, the diagnostic module 208 may generate an error message. The error message may be a signal to another system to indicate that there is a misreporting in the battery monitoring circuit. The amount of difference necessary to constitute a predetermined amount of difference may be determined based on allowed tolerances, and does not need to be one value, but may change with time or driving conditions. According to an example embodiment, the predetermined amount of tolerance may be plus or minus around 7 mV.

Figure 3:
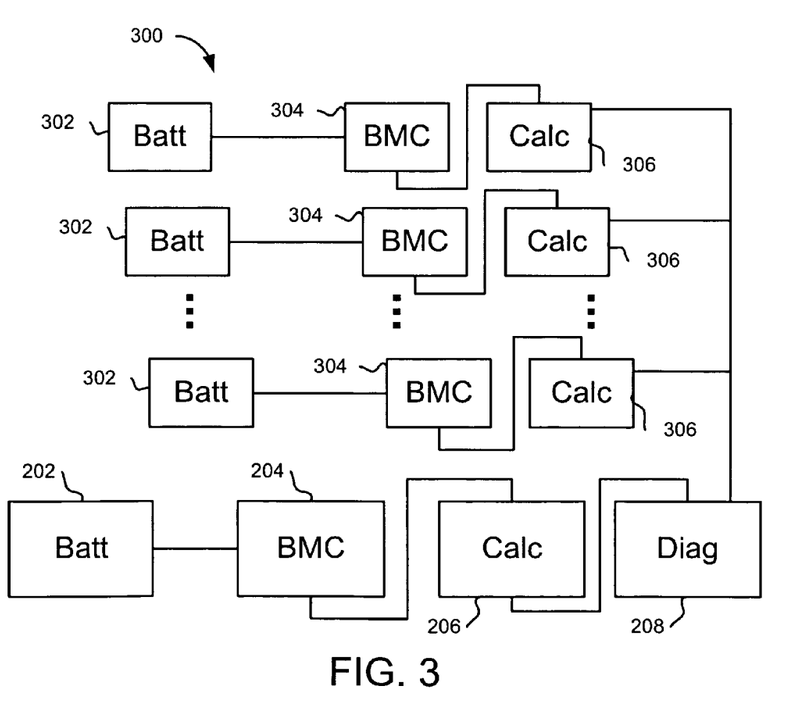
FIG. 3 is a block diagram of another system for diagnosing battery voltage misreporting according to various embodiments.

FIG. 3 is a block diagram of another system 300 for diagnosing battery voltage misreporting according to various embodiments. The system 300 includes the battery monitoring circuit (BMC) 204 monitoring the battery 202, the calculation module 206 and the diagnostic module 208, as well as additional batteries 302, additional BMCs 304 and additional diagnostic modules 306.

As discussed above, the BMC 204 monitors the battery 202 and sends the monitored information to the calculation module 206. The calculation module 206 may operate as described above and send its data to the diagnostic module 208. In a particular example application, the battery 202 may be one battery out of a group of batteries. The battery 202 and the additional batteries 302 may make up at least a part of a battery pack and may be connected in parallel. Each additional battery 302 may have one of the additional BMCs 304 to monitor its voltages in time. Similar to the BMC 204, the additional BMCs 304 may take the monitored additional battery 302 information and pass it along to the additional calculation modules 306. The additional calculation modules 306 may then perform calculations to generate at least one of time derivative based battery charge state data, corresponding curves, areas and centroids, similar to as discussed above with reference to FIG. 1. This data may then be sent form the additional calculation modules 306 to the diagnostic module 208.

The diagnostic module 208 may use the data from the additional calculation modules 306 to compare with the data from the calculation module 206. Substantial differences in the data may warrant the generation of an error message. The data analyzed by the diagnostic module 208, from the battery 202 and the additional batteries 302 represent an aggregate set of battery charge state data, and any substantial variations (within tolerances) in data from one battery (the battery 202 or the additional batteries 302) as compared with the rest may cause the diagnostic module 208 to generate one or more error messages.

Figure 4:
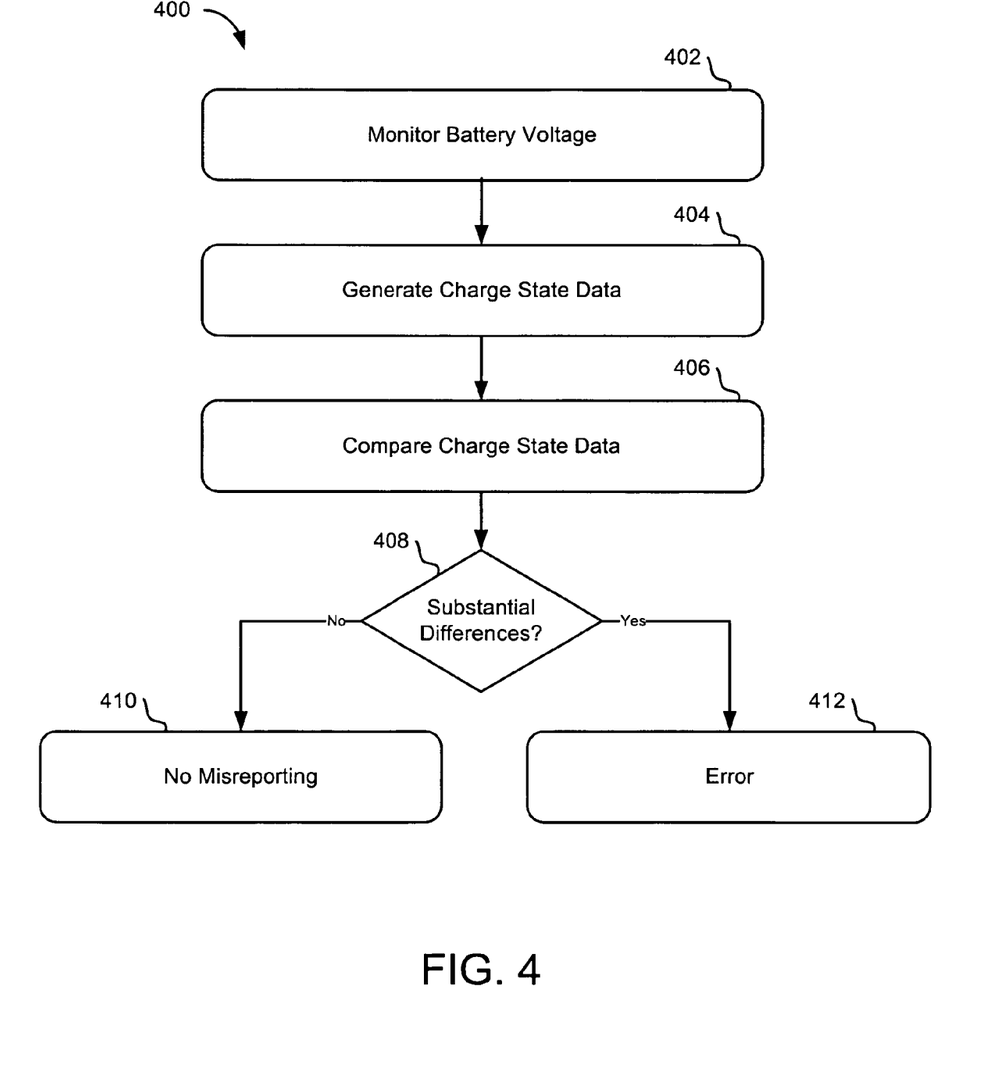
FIG. 4 is a flow diagram illustrating a method for diagnosing battery voltage misreporting according to various embodiments.

FIG. 4 is a flow diagram illustrating a method 400 for diagnosing battery voltage misreporting according to various embodiments. The method begins by monitoring the voltage present in a battery (block 402). The monitoring may be constant or periodic and may take into count the time and the state of charge of the battery (as a percentage). Battery charge state data may be generated based off of the monitored battery information (block 404). The battery charge state data may include a calculation of the change in voltage over a change in time (i.e. time derivative dV/dt) for a range of voltage levels. Additional calculations may be used to create a curve representative of the change in voltage over a change in time for each voltage within the range. According to various embodiments, the curve may be graphed on an x-y plane with voltage on the x axis and dV/dt on the y axis. According to some embodiments, the area beneath the curve may be calculated (through integration), and a centroid for that area may be determined.

The battery charge state data may be compared with an expected set of data to determine the similarity (block 406). According to various embodiments, the raw battery charge state data may be used for the comparison, or the calculated curve, area beneath the curve or the centroid may be used. A difference between the battery charge state data represented by a curve and the expected set of data may be visualized as a shift in the x or y directions. If the are beneath the curve is used, the comparison is simply a scalar value comparison. Similarly, if the centroid data is used for comparison with the expected set of data, it may be as simple as comparing x,y coordinates.

Comparison of the battery charge state data and the expected set of data will allow for a determination of whether substantial differences exist (block 408). The determination of a substantial difference may be based on acceptable tolerances with respect to the type and configuration of the battery or batteries being used. Various types of batteries (Li-Ion, Li-Polymer, NiCd, NiMH, and others) are contemplated, and the acceptable tolerances for each may differ. Additionally, varying configurations of batteries (multiple series-oriented cells, serial-parallel combinations, and others) may change the amount of acceptable tolerance which would define a substantial difference in between the battery charge state data and the expected set of data. If there are no substantial differences, it may be determined that no misreporting has taken place (block 410). If substantial differences are found, an error may be generated (block 412).

Generally a misreporting error will signify that a BMC is misreporting the battery voltage that it is monitoring. In other words, if the actual battery voltage is X, the BMC may be reporting X plus or minus Y. It is also possible, however, that substantial differences are found between the battery charge state data and the expected set of data if the battery has substantially more or less capacity for charge than that associated with the expected set of data. Using the centroid based battery charge state data, when the coordinates of centroid associated with the battery charge state data are substantially different than the coordinates of the centroid associated with the expected set of data, the amount and type of misreporting may be identified. This will be discussed in more detail with reference to FIG. 5B below.

Figure 5A:
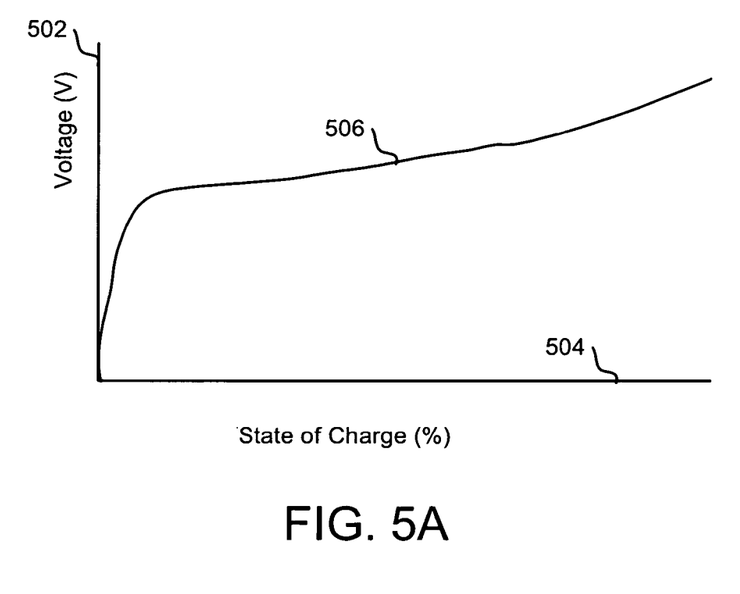
FIGS. 5A and 5B are charts illustrating various battery characteristics relating to diagnosing battery voltage misreporting according to various embodiments.
Figure 5B:
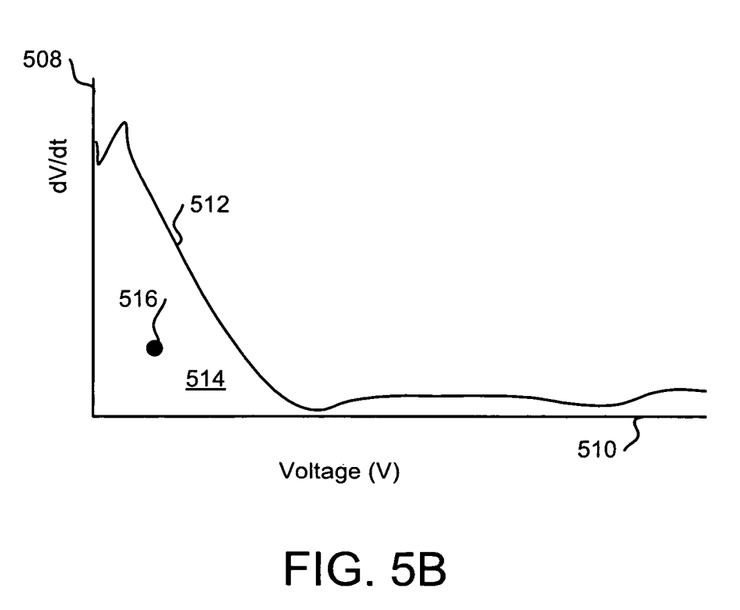

FIGS. 5A and 5B are charts illustrating various battery characteristics relating to diagnosing battery voltage misreporting according to various embodiments. FIG. 5A includes a voltage axis 502, a state of charge axis 504 and a representative curve 506. During charge or discharge of a battery, the voltage at the battery may be monitored and measured with respect to the battery state of charge. The representative curve 506 for a particular battery may differ from other batteries, even batteries of like-type chemistry. The slope of the representative curve 506, however, at any given voltage will be substantially similar for batteries of like-type chemistry. Assuming a known or constant charge (or discharge) rate, the change in state of charge over time can be constant, and a chemistry characteristic time derivative curve of dV/dt versus voltage can be generated. This curve is represented with reference to the chart in FIG. 5B below.

FIG. 5B includes a time derivative (dV/dt) axis 508, a voltage axis 510, a time derivative curve 512, an area beneath the curve 514, and a centroid of the area beneath the curve ("centroid") 516. Between batteries of like-type chemistry, respective time derivative curves 512 should be substantially similar. Dissimilarities in time derivative curves 512 of batteries of like-type chemistry can be explained by misreporting of battery voltage, or a variance in battery charge capacity. A shift in a time derivative curve 512 along the dV/dt axis 508 means that the change in voltage over time is generally either faster or slower, which can be indicative of less or more capacity respectively. A shift in the time derivative curve 512 along the voltage axis 510 can be in indication that a particular slope or dV/dt value is being reported at a lower or higher than expected voltage value Since batteries of like-type chemistry share similar dV/dt values at each voltage, a dV/dt value that lower or higher than expected can be indicative of a misreporting. The term "shift" should be taken to mean a shifted difference between a particular curve and an expected or reference curve.

In order to compare the battery charge state data of a battery with an expected set of data (which may be a reference set or data gathered from other batteries according to various embodiments), additional calculations may be used. Once time derivative versus voltage data is obtained, the time derivative curve 512 may be generated. An integration of the time derivative curve 512 over a range of voltages may be used to determine the area beneath the curve 514. This produces a scalar value associated with a battery and BMC that may be used for comparison purposes. Comparisons of the area beneath the curve 514 may be used to determine battery voltage misreporting or capacity variances. Differing sizes for the area beneath the curve 514 can indicate dissimilar or shifted time derivative curves 512. Additionally, a centroid 516 of the area beneath the curve 514 may be calculated and used as battery charge state data for comparison with an a centroid calculated from an expected set of data. Differences in the position of the centroids 516 can indicate battery voltage misreporting or capacity variances. Similar to the time derivative curve 512, as discussed above, a centroid 516 that is at a higher or lower position than expected on the dV/dt axis 508 can be indicative of less or more relative capacity respectively. A centroid 516 that is positioned to the left or right of an expected position on the voltage axis 510 can be indicative of under-reporting or over-reporting of battery voltage.

When a misreporting is determined, an error message may be generated. The error message may be a signal that is communicated between a diagnostic system and one or more other systems. The error message may be communicated to a charging system 122 to cause the charging system 122 to limit the amount of charge to be applied to the battery (or battery pack). Similarly, the error message may cause the charging system 122 to prevent the battery from charging at all. As a result, a message may be presented to a user that the battery is in need of service. As another option, according to various embodiments, an error message from a diagnostic system may allow another circuit (e.g., the vehicle management system 116) to compensate for the misreporting BMC. For example, if the faulty BMC is reporting 3.6V when the battery is actually at 3.8V, the voltage reporting signal from that BMC may be compensated by 0.2V to make it correct.

As mentioned above, comparing battery charge state data to an expected set of data may reveal charge capacity variances—for a particular battery or between batteries. Charge capacity changes or variations affect the amount that a battery or a battery pack may be charged. As such, range and capacity calculations (which may be presented to a user) may be affected by these changes and variations in charge capacity. When an error or misreporting is determined with respect to charge capacity, adjustments to range, capacity and other calculations may be made to provide more accurate information or estimates.

Figure 6:
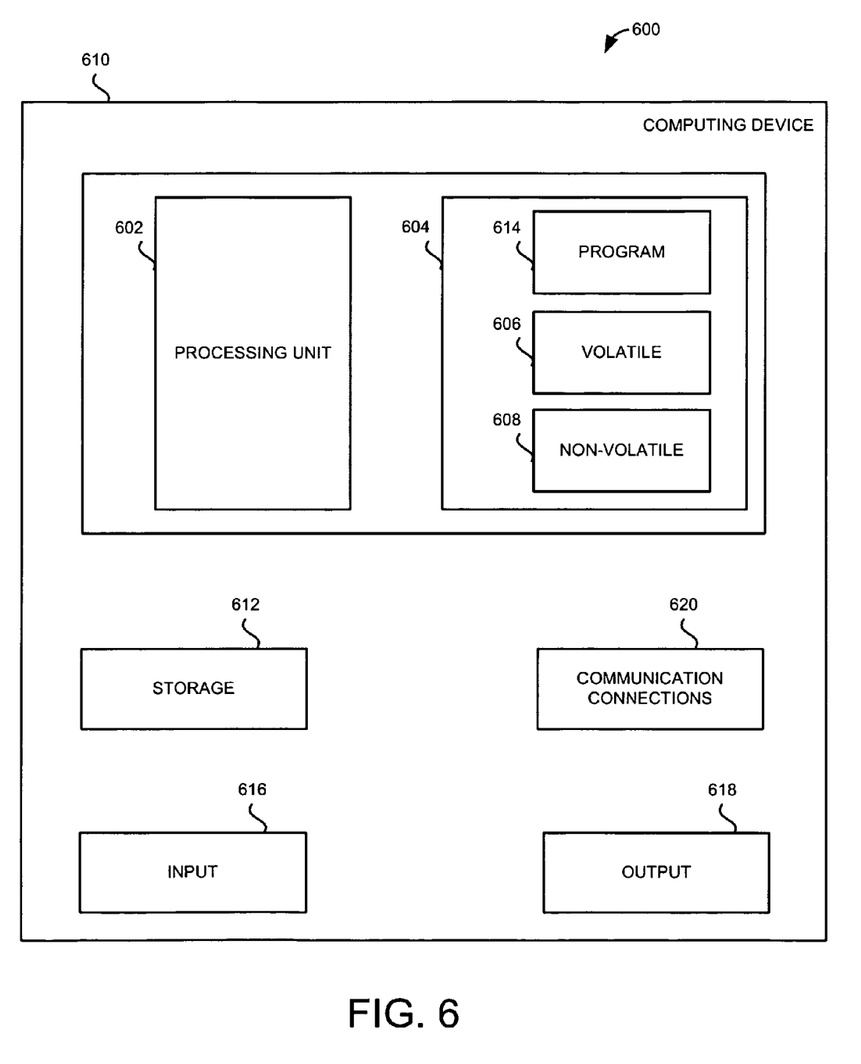
FIG. 6 illustrates a computer system that executes programming for diagnosing battery voltage misreporting according to various embodiments.

FIG. 6 illustrates a computer system that executes programming for diagnosing battery voltage misreporting according to various embodiments. A general computing device 610, may include a processing unit 602, memory 604, and storage 612. Computer-readable instructions stored on a computer-readable medium are executable by the processing unit 602 of the computing device 610. A hard drive, CD-ROM, and RAM are some examples of articles including a computer-readable medium. Instructions for implementing any of the above described methods and processes may be stored on any of the computer readable media for execution by the processing unit 602. The memory 604 may include volatile memory 606 and/or non-volatile memory 608. Additionally, the memory 604 may include program data 614 which may be used in the execution of various processes. Storage for the computing device may include random access memory (RAM), read only memory (ROM), erasable programmable read-only memory (EPROM) & electrically erasable programmable read-only memory (EEPROM), flash memory, one or more registers, or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions.

The computing device 610 may include or have access to a computing environment that may include an input 616, an output 618, and communication connections 620. The computing device 610 may operate in a networked environment using a communication connection to connect to one or more other computing devices, processors or other circuits. In some embodiments, the computing device 610 may reside on one or more devices for measuring and/or calculating battery charge state data. The computing device 610 may utilize the communication connections 620 to interact with other systems to report and manage voltage misreporting or charge capacity errors.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

What is claimed is:

1. A method for diagnosing a battery voltage misreporting, the method comprising:
    monitoring a voltage of a battery;
    calculating a time derivative curve of the monitored battery voltage across a range of battery voltages;
    monitoring a second voltage corresponding to a second battery;
    calculating a second time derivative curve of the second monitored battery voltage across said range of battery voltages;
    setting said second time derivative curve as an expected set of data
    comparing the time derivative curve to the expected set of data; and
    generating an error message if the time derivative curve differs from the expected set of data by a predetermined amount.

2. The method of claim 1, wherein the monitoring step is performed during charging of the battery.

3. The method of claim 1, wherein the expected set of data is based on an idealized battery.

4. The method of claim 1, further comprising the step of determining an amount corresponding to a shift between the time derivative curve and the second time derivative curve along a dV/dt axis, wherein said step of generating said error message further comprises comparing the amount of said shift to said predetermined amount.

5. The method of claim 1, further comprising the step of determining an amount corresponding to a shift between the time derivative curve and the second time derivative curve along a voltage axis, wherein said step of generating said error message further comprises comparing the amount of said shift to said predetermined amount.

6. The method of claim 1, further comprising the steps of integrating the time derivative curve to determine a first scalar value, wherein said comparing step further comprises comparing the first scalar value with a second scalar value based on said expected set of data.

7. The method of claim 1, wherein the monitoring step is performed during discharge of the battery.

8. The method of claim 1, wherein the expected set of data is based on a reference battery.

9. The method of claim 1, further comprising the steps of:
    monitoring at least one other voltage corresponding to at least one additional battery;
    calculating at least one other time derivative curve across said range of battery voltages, wherein said at least one other time derivative curve corresponds to said at least one additional battery; and
    basing said expected set of data on said at least one other time derivative curve.

10. The method of claim 9, wherein said at least one other time derivative curve is comprised of a plurality of other time derivative curves, and wherein said expected set of data is based on an average of said plurality of other time derivative curves.

11. The method of claim 1, further comprising the step of modifying operation of a charging system coupled to said battery in response to said error message.

12. The method of claim 1, further comprising the step of terminating operation of a charging system coupled to said battery in response to said error message.

13. A system for diagnosing battery voltage misreporting, the apparatus comprising:
    a battery measurement circuit to measure the voltage of a battery to create battery voltage data;
    one or more additional battery measurement circuits to measure voltages across one or more additional batteries to create additional voltage data;
    a calculation module to receive the battery voltage data and to calculate time derivatives from the battery voltage data across a range of battery voltages;
    at least one additional calculation module to receive the additional battery voltage data and to calculate time derivatives of the measured voltages across a voltage range to generate an expected set of time derivatives; and
    a diagnostic module to compare the calculated time derivatives to said expected set of time derivatives, the diagnostic module to generate an error message if the calculated time derivatives are substantially different than the expected set of time derivatives.

14. The system of claim 13, wherein the battery is a lithium-ion battery.

15. The system of claim 13, further comprising a charging system to receive the error message and to limit charging of the battery.

16. The system of claim 15, wherein the charging system substantially disallows charging of the battery.

17. The system of claim 13, further comprising a vehicle management system to receive the error message and to adjust the voltages indicated by the battery measurement circuit.

18. A system for diagnosing battery voltage misreporting, the apparatus comprising:
- a battery measurement circuit to measure the voltage of a battery to create battery voltage data;
- a calculation module to receive the battery voltage data and to calculate a time derivative curve from the battery voltage data across a range of battery voltages; and
- a diagnostic module to compare the time derivative curve to an expected set of data, wherein the diagnostic module generates an error message if the time derivative curve is different from the expected set of data by more than a predetermined amount, wherein the calculation module further integrates said time derivative curve to determine a first scalar value, wherein the diagnostic module compares the first scalar value to a second scalar value based on the expected set of data and generates the error message if the first scalar value is different from the second scalar value by more than the predetermined amount.

19. The system of claim 18, wherein the expected set of data is based on an idealized battery.

20. The system of claim 18, wherein the expected set of data is based on a reference battery.

21. The system of claim 18, further comprising a charging system coupled to the diagnostic system, wherein said charging system terminates battery charging when the diagnostic module generates the error message.

22. The system of claim 18, further comprising a charging system coupled to the diagnostic system, wherein said charging system modifies battery charging when the diagnostic module generates the error message.

23. The system of claim 18, further comprising a vehicle management system coupled to the diagnostic system, wherein said vehicle management system modifies voltages reported by the battery measurement circuit when the diagnostic module generates the error message.

\* \* \* \* \*